(12) United States Patent
Bayat et al.

(10) Patent No.: US 11,056,169 B2
(45) Date of Patent: Jul. 6, 2021

(54) CURRENT COMPARATOR FOR SUBMICRON PROCESSES

(71) Applicant: MENTIUM TECHNOLOGIES INC., Santa Barbara, CA (US)

(72) Inventors: Farnood Merrikh Bayat, Santa Barbara, CA (US); Jaroslaw Sulima, Santa Barbara, CA (US); Mirko Prezioso, Santa Barbara, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 0 days.

(21) Appl. No.: 16/932,258

(22) Filed: Jul. 17, 2020

(65) Prior Publication Data

US 2021/0018541 A1 Jan. 21, 2021

Related U.S. Application Data

(60) Provisional application No. 62/875,066, filed on Jul. 17, 2019.

(51) Int. Cl.
| | |
|---|---|
| *G01R 19/10* | (2006.01) |
| *G11C 11/406* | (2006.01) |
| *G11C 11/4074* | (2006.01) |
| *G11C 5/02* | (2006.01) |
| *G11C 11/4091* | (2006.01) |
| *G11C 11/4093* | (2006.01) |
| *G01R 19/00* | (2006.01) |
| *G05F 1/56* | (2006.01) |
| *G05F 1/575* | (2006.01) |
| *G11C 7/10* | (2006.01) |
| *G11C 11/4094* | (2006.01) |

(Continued)

(52) U.S. Cl.
CPC .... *G11C 11/40626* (2013.01); *G01R 19/0038* (2013.01); *G01R 19/10* (2013.01); *G05F 1/561* (2013.01); *G05F 1/575* (2013.01); *G11C 5/025* (2013.01); *G11C 7/1096* (2013.01); *G11C 11/4074* (2013.01); *G11C 11/4091* (2013.01); *G11C 11/4093* (2013.01); *G11C 11/4094* (2013.01); *G11C 11/4097* (2013.01); *H03K 17/22* (2013.01)

(58) Field of Classification Search
None
See application file for complete search history.

(56) References Cited

U.S. PATENT DOCUMENTS

| | | |
|---|---|---|
| 6,687,165 B1 | 2/2004 | Cioaca |
| 6,813,194 B2 | 11/2004 | Tran et al. |

(Continued)

OTHER PUBLICATIONS

PCT International Search Report and Written Opinion issued in corresponding Application No. PCT/US2020/042666, dated Nov. 20, 2020.

*Primary Examiner* — Cassandra F Cox
(74) *Attorney, Agent, or Firm* — Maschoff Brennan

(57) ABSTRACT

A system for comparing currents is disclosed. The system may include a first current signal and a second current signal. The system may also include a subtractor that is configured to receive a plurality of current input signals and generate a single output current signal that is equal to a difference between the plurality of current input signals. The system may also include a current-to-voltage converter that is configured to receive the output current signal and convert it into an output voltage.

19 Claims, 2 Drawing Sheets

(51) Int. Cl.
*G11C 11/4097* (2006.01)
*H03K 17/22* (2006.01)

(56) References Cited

U.S. PATENT DOCUMENTS

| | | |
|---|---|---|
| 8,547,756 B2 | 10/2013 | Widjaja et al. |
| 9,419,596 B2 | 8/2016 | Yang et al. |
| 2006/0119496 A1* | 6/2006 | Tester ............ G05F 3/262 341/144 |
| 2010/0158055 A1* | 6/2010 | Giebel ............ G06K 7/10584 372/29.011 |
| 2019/0115077 A1 | 4/2019 | Shin et al. |

\* cited by examiner

CURRENT COMPARATOR FOR SUBMICRON PROCESSES

CROSS-REFERENCE TO A RELATED APPLICATION

This patent application claims the benefit of and priority to U.S. Provisional Application No. 62/875,066 filed Jul. 17, 2019, which is incorporated herein by reference.

BACKGROUND

Current comparators are circuits that determines whether one current is larger than another current. Current comparators have many applications in a variety of analog circuits. By moving toward more advanced technology nodes in CMOS process, designing accurate, fast and efficient current comparators gets harder and harder for several reasons. First, current amplitudes are getting smaller and smaller. For example, in the circuit operating in subthreshold, the amplitude of currents can be in a nA region. Secondly, with the reduction of current amplitudes, the signal to noise ratio will be also reduced making the design of accurate current comparators a challenging problem. Thirdly, due to the increasing device-to-device variations in submicron processes, an acceptable level of accuracy may only be reached by using bulky circuits. Finally, high-speed current comparators require high-gain amplifiers, which are very power hungry.

Current comparators may work by first subtracting the two currents to be compared from one another using Kirchhoff's current law and then converting the subtraction result into voltage using current-to-voltage converter circuits. In this configuration, the sign and/or amplitude of the output voltage of the current-to-voltage converter may show whether the first current is larger than the second one or vice versa. However, using conventional current-to-voltage converters with resistive feedback is very sensitive to noise and device-to-device mismatch. Moreover, for large current differences, the current-to-voltage converter circuit may go into saturation reducing the speed of the circuit dramatically. To avoid saturation, the driving capability of the converter may be increased which may result in higher power consumption.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

In one embodiment, a system for comparing currents is provided. The system may include a subtractor that is configured to receive a plurality of current input signals and generate a single output current signal that is equal to a difference between the plurality of current input signals. The system may also include a current-to-voltage converter that is configured to receive the output current signal and convert it into an output voltage.

In some embodiments, the subtractor may be a mirror based subtractor.

In some embodiments, the output current may have a polarity and an amplitude that are proportional to a polarity and an amplitude of a resultant of the plurality of current input signal.

In some embodiments, the system may further include a pullup circuit and a pulldown circuit that are connected to the input of the current-to-voltage converter. The pullup and pulldown circuits may be configured to limit a maximum amplitude of the output current that may enter the current-to-voltage converter.

In some embodiments, the current-to-voltage converter may be an operational amplifier with a feedback element.

In some embodiments, the current-to-voltage converter may be a current integrator circuit having a feedback capacitor.

In some embodiments, the current integrator circuit may include a capacitor resetting mechanism configured to discharge the feedback capacitor between conversions.

In some embodiments, the output voltage may have an amplitude and polarity that are proportional to an amplitude and polarity of the output current signal.

In some embodiments, the system may further include a comparator configured to receive the output voltage and compare the output voltage with a predetermined voltage to determine which voltage is larger.

In some embodiments, the predetermined voltage may be equal to or close to an output voltage of the current-to-voltage converter module when its an output current signal is zero.

In another embodiment, a system for comparing currents in provided. The system may include a first current input signal having a positive polarity and a second current input signal having a negative polarity. The system may also include a subtractor that is configured to receive the first and second current input signals and generate a single output current signal that is equal to a difference between the first and second current input signals. The system may further include a current-to-voltage converter that is configured to receive the output current signal and convert it into an output voltage.

In some embodiments, the first current input signal may include the sum of a plurality of current input signals having a positive polarity, and the second current input signal may include the sum of a plurality of current input signals having a negative polarity.

The object and advantages of the embodiments will be realized and achieved at least by the elements, features, and combinations particularly pointed out in the claims. Both the foregoing summary and the following detailed description are exemplary and explanatory and are not restrictive of the invention as claimed.

BRIEF DESCRIPTION OF THE DRAWINGS

Example embodiments will be described and explained with additional specificity and detail through the use of the accompanying drawings in which.

DETAILED DESCRIPTION

Figure 1:
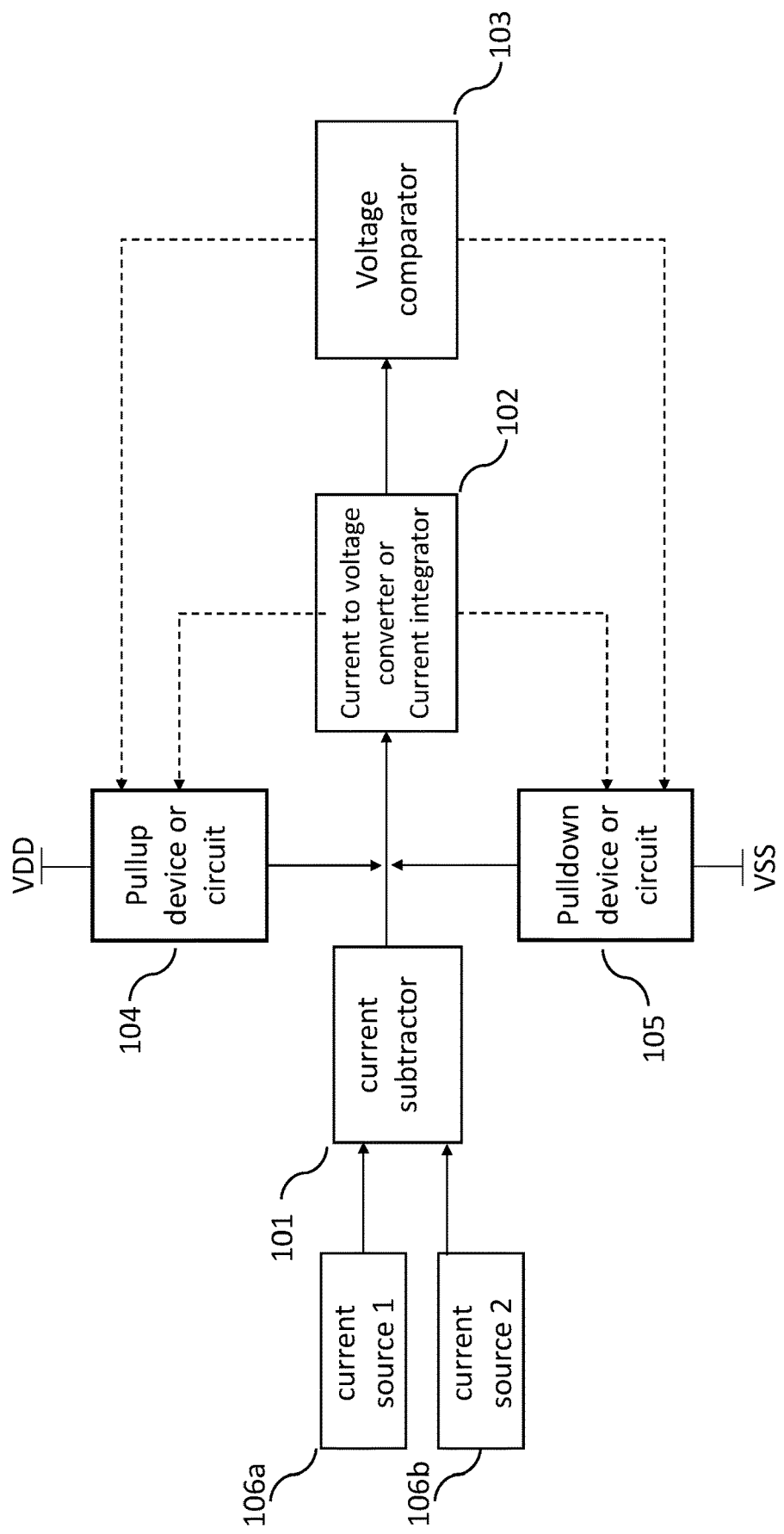
FIG. 1 illustrates an example of a current comparator system with assisting pullup and pulldown circuits.

One or more embodiments of the present disclosure may include a system. The system may include a current subtractor, a current-to-voltage converter, a voltage comparator, an operational amplifier, and pulling up and pulling down devices or circuits. The current subtractor may be configured to subtract the two current signals from one another to generate a single current signal equal to the difference of the two input current signals. The current difference may pass through a current-to-voltage converter to be converted into voltage. The current-to-voltage converter may include an operational amplifier forcing a fixed virtual voltage to the output of the current subtractor module. In some embodiments, the current-to-voltage converter may have a capacitor instead of resistor as a feedback element to convert the current-to-voltage. Using the capacitor instead of resistor as a feedback element may filter out the noise and reduce the sensitivity of the converter to process-induced mismatches and variations.

The output of the current-to-voltage converter may be compared with a fixed predetermined voltage to determine which input current is larger than the other one (or whether the current difference is lower or higher than zero). In some embodiments, the described current comparator system may also include pulling-up and pulling-down devices or circuits to help lower the current entering the current-to-voltage converter or integrator to prevent it from getting into saturation. When the converter's output is small, both of the pulling-up and pulling-down devices or circuits may be off allowing all the current to pass through the converter charging the feedback capacitor. As soon as the output of the convertor reaches the point that the output voltage comparator can make a reliable and correct decision about the sign of the current difference, based on the sign of the current charging the capacitor, one of the pulling-up and pulling-down devices or circuit may be turned on avoiding further currents to go into the converter/integrator keeping its operational amplifier away from the saturation region. Discharging the feedback capacitor may reset the converter to its initial state and ready for the next comparison.

The current comparator may be used in different applications including but not limited to analog-to-digital converters, analog in-memory computing architectures, etc.

In some embodiments, the system may include a current subtractor and a current-to-voltage converter. The current subtractor may accept two or more current signals with similar or different polarities and generate a single current signal equal to the subtraction of current signals with different polarities. The current subtractor circuit may be simple wires electrically coupled together or a more complicated circuit based on current adders and subtractors. In some embodiments, the polarity of some of the input currents may need to be reversed for example by using current mirror circuits. The resultant current of the subtractor circuit may be fed into the current-to-voltage converter. The current-to-voltage converter may accept the input current and convert it into a voltage signal where its amplitude and polarity may be proportional to the amplitude and polarity of the input current signal.

In some embodiments, the current-to-voltage converter may include an operational amplifier. The operational amplifier may help speeding up the current-to-voltage conversion.

In some embodiments, a current integrator circuit may be used as a current-to-voltage converter. Using an integrator for the current-to-voltage conversion may remove a noise from the current generated by the current subtractor module. Larger capacitive feedback elements may be used to remove noise better which may reduce the operating speed of the converter. In some other embodiments, an integrator may be used as a voltage-to-current converter to lower the sensitivity of the converter to device mismatch and device-to-device variations resulting in circuits with smaller layouts. An integrator used for current-to-voltage converter may include a capacitor resetting mechanism to discharge the feedback capacitor between conversions. In some other embodiments, the integration time of each conversion may be adjusted based on the amplitude of the incoming currents.

In some embodiments, the current-to-voltage converter may include an operational amplifier to provide a bias to the output stage of the current subtractor module or to the circuits sourcing currents to the current subtractor modules. Operational amplifiers with higher or lower gains may be used in the current-to-voltage converter to provide more or less accurate and stable biasing voltage for the current subtractor circuit. Operational amplifiers with higher or lower gains may consume more or less power during operation. In some embodiments where the current subtractor circuit or the circuits sourcing the input currents are not sensitive to the accuracy of the bias voltage generated by the current-to-voltage converter, an operational amplifier with low gain may be used to lower the power consumption.

Feedback devices used in the current-to-voltage converter may include a resistor, capacitor, FET transistor, or any other linear or nonlinear device. Capacitive feedbacks may be used in submicron processes with large mismatches and low signal to noise ratio.

The current comparator system may be configured to also include a voltage comparator circuit comparing the output voltage of the current-to-voltage converter with a predetermined voltage. The voltage comparator's output may be equal to VDD (VSS) if the output of the current-to-voltage converter is higher than the predetermined voltage and may be equal to VSS (VDD) if the output of the current-to-voltage comparator is lower than the predetermined voltage. The voltage comparator may be used to convert the analog output of the converter to digital to be used in digital circuits. In some other embodiments, the voltage comparator may be used as a gain amplifier to amplify the output of the converter. The voltage comparator may include an operational amplifier.

In some embodiments, the voltage comparator may be removed from the current comparator system and the output of the current-to-voltage converter may be directly connected to and used in digital systems.

In some other embodiments, the current comparator system may be configured to include a pullup and pulldown circuits connected to the input of the current-to-voltage converter. The pullup and pulldown circuits may be used to limit the maximum amplitude of the current that may enter the current-to-voltage converter. When the current amplitude entering the current-to-voltage converter is large enough, the output voltage of the converter may be big enough for making an accurate comparison between the input currents. In this situation, allowing more current to enter the current-to-voltage converter may just increase the power consumption of the whole system. When the output voltage of the converter is higher or lower than some threshold values, one of the pullup or pulldown circuits may be turned on to limit the current entering the converter and preventing the converter's output from getting larger or smaller anymore.

In some embodiments, the pullup and pulldown circuits may be used to reduce the power consumption of the current-to-voltage converter and the current comparator system.

In some other embodiments, the pullup and pulldown circuits may be used to speed up the current-to-voltage conversion process by preventing the output of the converter circuit to become too large or too small and entering the saturation region. The threshold voltages at which the pullup or pulldown circuits may turn on may depend on the levels of voltages that the voltage comparator or digital circuits can correctly recognize as low or high. Whenever the output voltage of the converter is small (compared to its idle voltage), both pullup and pulldown circuits will remain off allowing all the current generated by the current subtractor to enter the current-to-voltage converter.

The pullup and pulldown circuits may reduce the maximum current the current-to-voltage converter may need to provide resulting in lower chip area and lower power consumption. In some embodiments, the pullup and pulldown circuits may consume power only if they are turned on which may happen when only when the amplitude of the current entering the converter is large. The higher the output of the converter gets, the more the pullup or pulldown circuit may be turned on until their current may become equal to the current generated by the current subtractor module.

In some embodiments where the current integrator is used as a current-to-voltage converter, the pullup or pulldown circuits may be used to limit the maximum integral of current in a given period of time which may enter the current-to-voltage converter.

These and other embodiments of the present disclosure will be explained with reference to the accompanying figures. In the figures, features with like numbers indicate like structure and function unless described otherwise.

FIG. 1 illustrates an example of a current comparator system which may include a first current sources 106a, a second current source 106b, a current subtractor 101, a current-to-voltage converter or a current integrator 102, a voltage comparator 103, a pullup circuit 104 and a pulldown circuit 105.

The current sources 106a and 106b may any circuit or device that may sink or source currents when activated. In some embodiments, more than two current sources may enter the current subtractor 101. Alternatively, current sources 106a and 106b may include more than two current sources. For example, current source 106a may include the sum of multiple currents with the same polarity. Current source 106b may also include the sum of multiple currents with the same polarity. Current sources 106a and 106b may have opposite polarities.

Because the polarity and amplitude of the output of the current comparator system depends on the polarity and amplitude of the current entering the system, the system may work even with a single current source or when all the sources are sinking or sourcing currents. The currents 106a and 106b generated by the current source modules may enter the current subtractor circuit 101 which may subtract the sum of sourcing currents from the sum of sinking currents or vice versa. The current subtractor module may include any type of current subtractor circuits like current mirror based subtractors. It may even be implemented by just electrically coupling the outputs of the current sources 106 together. The current subtractor module 101 may generate an output current with a polarity and amplitude proportional to the polarity and amplitude of resultant of all currents entered the subtractor. The generated current may enter the current-to-voltage converter module 102 to be converted into voltage.

In some embodiments, the current-to-voltage converter module 102 may receive a resultant current from the current subtractor 101 and convert it to a voltage with an amplitude and polarity proportional to the received current. The current-to-voltage converter module 102 may use a linear or nonlinear conversion. In some embodiments, the current-to-voltage converter 102 may include an operational amplifier with a feedback element. The feedback element may be a simple resistor, capacitor, FET transistor, or a more complicated circuit. The operational amplifier used in the current-to-voltage converter may be used to bias the output stage of the current subtractor 101 or input current sources 106. For zero current, the output of the converter may be at a fixed voltage close to the middle of the swing range and determined by the biasing condition of the operational amplifier. By the increase of the amplitude of the entering current, the output voltage of the converter may become higher or lower than this middle voltage allowing the next stage to correctly decide about the polarity of the resultant current. In some embodiments, a current integrator may be used as a current-to-voltage converter 102 to increase the accuracy of conversion and to reduce the chip area in submicron processes with large mismatches and device-to-device variations. The integrator may include a reset mechanism to discharge the integrator after each conversion.

In some embodiments, the current comparator system of FIG. 1 may include a voltage comparator or a gain amplifier 103 to amplify the output voltage of the current-to-voltage converter 102. The output of the voltage comparator 103 may directly be connected to the input of a digital gate and used in digital systems (no shown in FIG. 1). In some embodiments, the voltage comparator may include an open-loop operational amplifier and may compare the output voltage of the current-to-voltage converter 102 with a fixed predetermined value equal or close to the output voltage of the current-to-voltage converter module when its input current is zero. In some other embodiments, the voltage comparator 103 may be removed and the output voltage of the current-to-voltage converter 102 may be directly used instead.

The current comparator system of FIG. 1 may be configured to also include a pullup and pulldown circuits 104 and 105 to lower the power consumption of the system and the chip area. The pullup circuit 104 may source a current to the node connecting the current subtractor 101 to the current-to-voltage converter 102 when activated. The amplitude of the current sourced by the pullup circuit 104 to the common node may be proportional to the amplitude of the voltage applied to its control gate or terminal. When the amplitude of the voltage applied to the gate of the pullup circuit 104 is lower than the threshold voltage, the pullup circuit 104 may source zero or negligible current. By increasing the voltage on the control gate, the pullup circuit 104 may generate more and more currents to the common node. The pulldown circuit 105 may sink a current from the node connecting the current subtractor 101 to the current-to-voltage converter 102 when activated. The amplitude of the current sank by the pulldown circuit 105 from the common node may be proportional to the amplitude of the voltage applied to its control gate or terminal. When the amplitude of the voltage applied to the gate of the pulldown circuit 105 is higher than the threshold voltage, the pulldown circuit 105 may sink zero or negligible current. By decreasing the voltage on the control gate, the pulldown circuit 105 may generate more and more currents taken from the common node. The currents generated by either the pullup circuit 104 or the pulldown circuit 105 may reduce or completely stop the current from entering the current-to-voltage converter 102. When the difference of the output voltage of the current-to-voltage converter 102 and subsequently the output of the voltage comparator from their idle voltage is large enough that allows correct and fast detection of the polarity of the current entering the current-to-voltage converter 102, the pullup circuit 104 or the pulldown circuit 105 may be turned on (based on the amplitude of the output voltage of the current-to-voltage converter) to prevent the output voltages of blocks 102 and 103 to further increase or decrease.

In some embodiments, the pullup circuit 104 or the pulldown circuit 105 may be a resistor, simple FET transistor or a more complicated circuit.

In some embodiments, the pullup circuit 104 and the pulldown circuit 105 may be controlled directly or indirectly by the output voltage of the current-to-voltage converter 102 or the voltage comparator 103.

In some embodiments, the pullup circuit 104 or the pulldown circuit 105 may be used to prevent the current-to-voltage converter 102 and/or the voltage comparator 103 to enter the saturation which may reduce the response time and speed of the current comparator system.

In some embodiments, a big portion of the large currents generated by the current subtractor 101 may be provided by either the pullup or pulldown circuits (depending the polarity of the output current of the current subtractor module 101) rather than the current-to-voltage converter 102 reducing the power consumption and chip area of the current-to-voltage converter while increasing its speed.

Figure 2:
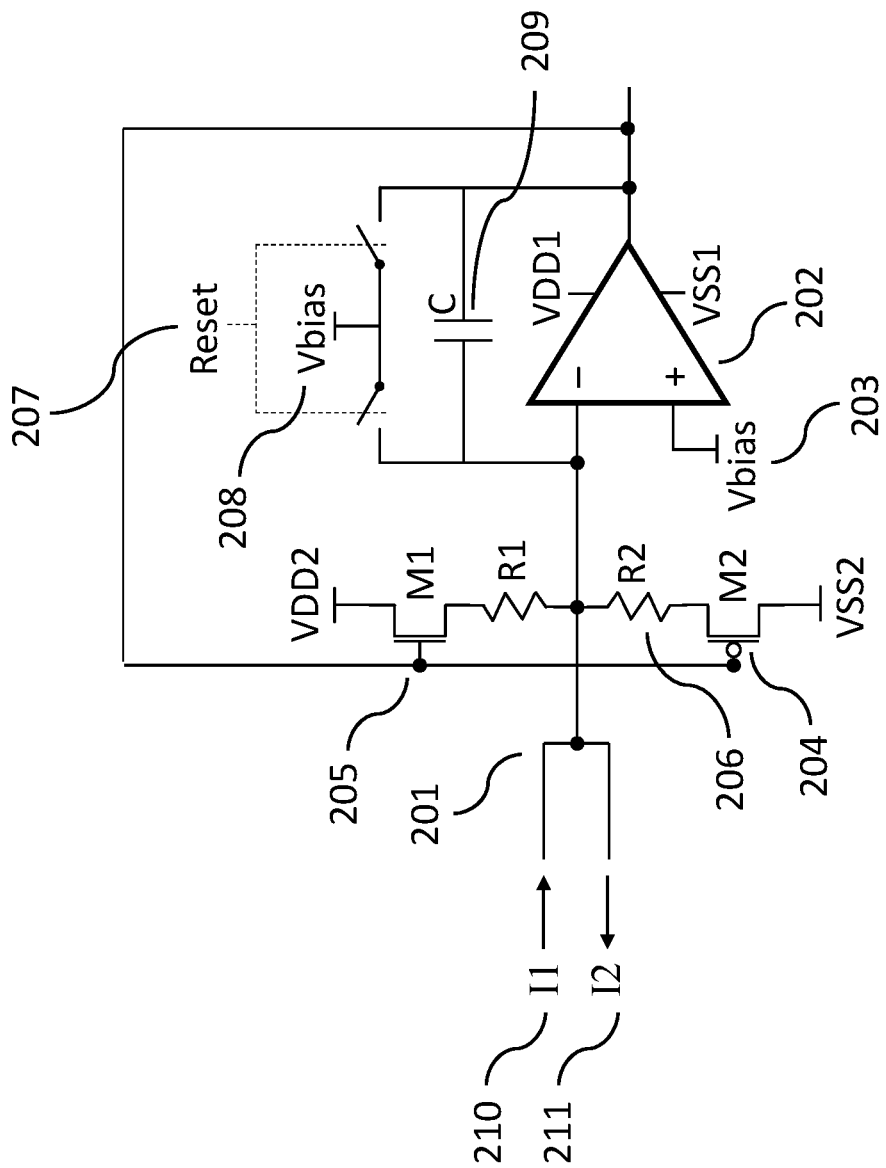
FIG. 2 illustrates another circuit-level example of the current comparator system.

FIG. 2 illustrates an example of the current comparator circuit that may be implemented in the environment of FIG. 1, in accordance with at least one embodiment described in the present disclosure. In this configuration, one or multiple input currents 210 and 211 with equal or different polarities may be subtracted from one another using a simple current subtractor 201 which may be implemented by electrical coupling of the outputs of the current sources 210 and 211. The current subtractor 201 may subtract the sum of currents entering the subtractor 201 from the sum of currents exiting the subtractor and generate a current equal to the subtraction of these two sets of currents. The current subtractor's resultant current may exit the subtractor if the sum of currents entering the subtractor is larger than the currents exiting the subtractor and vice versa. The subtractor's output current may enter a current integrator circuit which may include an operational amplifier 202, a capacitive feedback element 209, integrator discharging mechanism 207.

In some embodiments, the capacitor 209 may first be discharged by the activation of reset control signal 207 forcing the output voltage of the operational amplifier to its idle voltage Vbias 203. Vbias may be a voltage between VSS and VDD and may be close to the middle of the voltage range between VSS and VDD. In some embodiments, the bias voltage 208 with a voltage value of Vbias may be applied to terminals of the capacitor 209 to increase the speed of the resetting or capacitor discharging process. The reset control signal 207 may be deactivate afterward allowing the capacitor 209 to be charged entering the current integrator (i.e. the output current of the current subtractor).

If the current charging the capacitor is entering the integrator, the output voltage of the operational amplifier may gradually move from Vbias toward VSS with the speed proportional to the capacitance of the feedback capacitor 209 and the amplitude of the current. If the current charging the capacitor is exiting the integrator, the output voltage of the operational amplifier may gradually move from Vbias toward VDD. If the output voltage of the operational amplifier 202 gets too close to VSS or VDD, the amplifier may get into saturation resulting in slower operation and loosing the feedback which forces Vbias to the negative terminal of the operational amplifier. In some embodiments, the feedback capacitor 209 may be reset preventing the operational amplifier 202 from entering saturation.

In some embodiments, there may be a pullup NMOS transistor 205 with a threshold voltage of Vthn and its gate connected to the output of the operational amplifier 202 or the voltage comparator, its source to the input of the integrator and its drain to the voltage like VDD which is higher than Vbias. whenever the output voltage of the operational amplifier 102 while charging the capacitor gets higher than the Vbias+Vthn, the NMOS transistor 205 may gradually start turning on and sourcing current to the input of the integrator. The current generated by the pullup transistor 205 may reduce the current entering the integrator till the current entering the integrator may become equal to zero. Having zero current entering the integrator may stop the output voltage of the integrator 202 to increase further preventing it from entering the saturation. In some embodiments, a resistor R1 may be placed in between the source terminal of transistor M1 and the input of the integrator to adjust the voltage at which the transistor M1 may start to turn on.

In some other embodiments, there may be a pulldown PMOS transistor 204 with a threshold voltage of Vthp and its gate connected to the output of the operational amplifier 202 or the voltage comparator, its source to the input of the integrator and its drain to the voltage like VSS which is lower than Vbias. whenever the output voltage of the operational amplifier 102 while charging the capacitor gets lower than the Vbias–Vthp, the PMOS transistor 204 may gradually start turning on and sinking current from the input of the integrator. The current generated by the pulldown transistor 204 may reduce the current entering the integrator till the current entering the integrator may become equal to zero. Having zero current entering the integrator may stop the output voltage of the integrator 202 to reduce further preventing it from entering the saturation. In some embodiments, a resistor R2 may be placed in between the source terminal of transistor M2 and the input of the integrator to adjust the voltage at which the transistor M2 may start to turn on.

In some other embodiments, the feedback capacitor 209 may be replaced with a resistor or a FET transistor, or a PMOS and NMOS transistors connected together in parallel, or a more complicated circuit. The reset mechanism 207 and 208 may be removed if the current-to-voltage converter is not a current integrator.

In some other embodiments, the operational amplifier 202 with a feedback element may be used to also bias the circuits generating the input currents 210 and 211 with a Vbias voltage applied to the positive terminal of the operational amplifier 202.

In some other embodiments, there may be a voltage comparator or an open-loop gain amplifier (not shown in FIG. 2) connected to the output of the operational amplifier 202 comparing its output with a fixed voltage equal or close to Vbias amplifying the output of the integrator. The output of the integrator or the voltage comparator may be directly or indirectly used in other analog or digital circuits.

In some embodiments, the pullup and pulldown circuits may be used to prevent the operational amplifier 202 from entering the saturation which may result in the negative terminal of the operational amplifier to have a voltage other than the Vbias. Any change in the voltage of the negative terminal of the operational amplifier may change the biasing condition of the input current sourcing circuits 210 and 211 which may also change the amplitudes of the currents entering the current comparator system.

The pullup and pulldown transistors M1 and M2 may be resized carefully so they can provide the maximum current of I1–I2 or I2–I1.

In some embodiments, the exact value and the accuracy or the feedback capacitor may not be important since the comparator may just need to detect the sign of the current entering the integrator.

When comparing large currents, a resistive feedback element may be used instead of capacitor to increase the speed of the current comparator system. When dealing with small and noisy currents, a large capacitor may be used as a feedback element to filter out the noise.

In some embodiments, the pullup and pulldown transistors may be replaced with other circuits with similar functionalities.

In accordance with common practice, the various features illustrated in the drawings may not be drawn to scale. The illustrations presented in the present disclosure are not meant to be actual views of any particular apparatus (e.g., device, system, etc.) or method, but are merely example representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the summary, detailed description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

The foregoing description, for purpose of explanation, has been described with reference to specific embodiments. However, the illustrative discussions above are not intended to be exhaustive or to limit the invention as claimed to the precise forms disclosed. Many modifications and variations are possible in view of the above teachings. The embodiments were chosen and described to explain practical applications, to thereby enable others skilled in the art to utilize the invention as claimed and various embodiments with various modifications as may be suited to the particular use contemplated.

The invention claimed is:

1. A system for comparing currents comprising:
 a subtractor configured to receive a plurality of current input signals and generate a single output current signal that is equal to a difference between the plurality of current input signals; and
 a current-to-voltage converter configured to receive the output current signal and convert it into an output voltage, wherein the current-to-voltage converter is a current integrator circuit having a feedback capacitor.

2. The system of claim 1, wherein the subtractor is a mirror based subtractor.

3. The system of claim 1, wherein the output current has a polarity and an amplitude that are proportional to a polarity and an amplitude of a resultant of the plurality of current input signals.

4. The system of claim 1 further comprising a pullup circuit and a pulldown circuit connected to the input of the current-to-voltage converter, wherein the pullup and pulldown circuits are configured to limit a maximum amplitude of the output current that may enter the current-to-voltage converter.

5. The system of claim 1, wherein the current-to-voltage converter is an operational amplifier with a feedback element.

6. The system of claim 1, wherein the current integrator circuit includes a capacitor resetting mechanism configured to discharge the feedback capacitor between conversions.

7. The system of claim 1, wherein the output voltage has an amplitude and polarity that are proportional to an amplitude and polarity of the output current signal.

8. The system of claim 1 further including a comparator configured to receive the output voltage and compare the output voltage with a predetermined voltage to determine which voltage is larger.

9. The system of claim 8, wherein the predetermined voltage is equal to or close to an output voltage of the current-to-voltage converter module when an output current signal is zero.

10. A system for comparing currents comprising:
 a first current input signal having a positive polarity;
 a second current input signal having a negative polarity;

a subtractor configured to receive the first and second current input signals and generate a single output current signal that is equal to a difference between the first and second current input signals; and a current-to-voltage converter configured to receive the output current signal and convert it into an output voltage.

11. The system of claim 10, wherein the first current input signal includes the sum of a plurality of current input signals having a positive polarity, and wherein the second current input signal includes the sum of a plurality of current input signals having a negative polarity.

12. The system of claim 11, wherein the output current has a polarity and an amplitude that are proportional to a polarity and an amplitude of a resultant of the first current signal and the second current signal.

13. The system of claim 10 further comprising a pullup circuit and a pulldown circuit connected to the input of the current-to-voltage converter, wherein the pullup and pulldown circuits are configured to limit a maximum amplitude of the output current that may enter the current-to-voltage converter.

14. The system of claim 10, wherein the current-to-voltage converter is an operational amplifier with a feedback element.

15. The system of claim 10, wherein the current-to-voltage converter is a current integrator circuit having a feedback capacitor.

16. The system of claim 15, wherein the current integrator circuit includes a capacitor resetting mechanism configured to discharge the feedback capacitor between conversions.

17. The system of claim 10, wherein the output voltage has an amplitude and polarity that are proportional to an amplitude and polarity of the output current signal.

18. The system of claim 10 further including a comparator configured to receive the output voltage and compare the output voltage with a predetermined voltage to determine which voltage is larger.

19. The system of claim 18, wherein the predetermined voltage is equal to or close to an output voltage of the current-to-voltage converter module when an output current signal is zero.

* * * * *